(12) United States Patent
Triyoso et al.

(10) Patent No.: US 7,618,902 B2
(45) Date of Patent: Nov. 17, 2009

(54) PLASMA TREATMENT OF A SEMICONDUCTOR SURFACE FOR ENHANCED NUCLEATION OF A METAL-CONTAINING LAYER

(75) Inventors: Dina H. Triyoso, Austin, TX (US); Olubunmi O. Adetutu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 340 days.

(21) Appl. No.: 11/290,320

(22) Filed: Nov. 30, 2005

(65) Prior Publication Data

US 2007/0123056 A1    May 31, 2007

(51) Int. Cl.
*H01L 21/31* (2006.01)
*H01L 21/469* (2006.01)
*H01L 21/336* (2006.01)

(52) U.S. Cl. ...................... 438/778; 438/758; 438/287; 438/783

(58) Field of Classification Search ................. 438/778, 438/689, 694, 758, 780, 783, 788, 720, 722, 438/754, 591, 785, 482, 513
See application file for complete search history.

(56) References Cited

U.S. PATENT DOCUMENTS

| | | | |
|---|---|---|---|
| 6,674,138 B1 * | 1/2004 | Halliyal et al. | 257/411 |
| 6,958,277 B2 | 10/2005 | Pomarede et al. | |
| 7,326,655 B2 * | 2/2008 | Joe | 438/774 |
| 2004/0147101 A1 * | 7/2004 | Pomarede et al. | 438/591 |
| 2006/0033678 A1 * | 2/2006 | Lubomirsky et al. | 345/32 |

OTHER PUBLICATIONS

International Search Report issued in corresponding PCT Application No. PCT/US06/60775 mailed Oct. 1, 2008.

* cited by examiner

*Primary Examiner*—Chuong A. Luu

(57) ABSTRACT

A method for forming a dielectric layer is provided. The method may include providing a semiconductor surface and etching a thin layer of the semiconductor substrate to expose a surface of the semiconductor surface, wherein the exposed surface is hydrophobic. The method may further include treating the exposed surface of the semiconductor substrate with plasma to neutralize a hydrophobicity associated with the exposed surface, wherein the exposed surface is treated using plasma with a power in a range of 100 watts to 500 watts and for duration in a range of 1 to 60 seconds. The method may further include forming a metal-containing layer on a top surface of the plasma treated surface using an atomic layer deposition process.

20 Claims, 1 Drawing Sheet

PLASMA TREATMENT OF A SEMICONDUCTOR SURFACE FOR ENHANCED NUCLEATION OF A METAL-CONTAINING LAYER

FIELD OF THE INVENTION

The present invention relates generally to semiconductor processing, and more particularly to plasma treatment of a semiconductor surface for enhanced nucleation of a metal-containing layer.

RELATED ART

Increasingly, semiconductor devices require thin $SiO_n$ based gate dielectric films. Thin $SiO_n$ based gate dielectric films, however, result in increased gate leakage. High dielectric constant (K) films are now being considered as a replacement for the $SiO_n$ based gate dielectric. Traditionally, high dielectric constant (K) films have been formed using a process known as atomic layer deposition (ALD). Thin gate dielectric films formed using the ALD process, however, result in poor nucleation of the high K dielectric on a silicon containing surface. Previous attempts to solve this problem have involved use of a standard clean (e.g., SC-2 clean). This step, however, deposits a thin layer of chemical oxide on which the gate dielectric material deposited using the ALD process nucleates. As a result, the chemical oxide becomes an integral part of the gate dielectric affecting the integrity and scaling of the gate dielectric. Furthermore, the chemical oxide reduces the overall dielectric constant of the gate dielectric film.

Thus, there is a need for methods for plasma treatment of a semiconductor surface for enhanced nucleation of a metal-containing layer.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE EMBODIMENTS

In one aspect, a method for forming a dielectric layer is provided. The method may include providing a semiconductor surface and etching a thin layer of the semiconductor substrate to expose a surface of the semiconductor surface, wherein the exposed surface is hydrophobic. The method may further include treating the exposed surface of the semiconductor substrate with plasma to neutralize a hydrophobicity associated with the exposed surface. The method may further include forming a metal-containing layer on a top surface of the plasma treated surface using an atomic layer deposition process.

In another aspect, a method for forming a high constant dielectric layer is provided. The method may include etching a thin layer of a semiconductor substrate to expose a surface of the semiconductor substrate, wherein the exposed surface is hydrophobic. The method may further include treating the exposed surface of the semiconductor substrate with plasma to neutralize a hydrophobicity associated with the exposed surface and to change a top layer of the semiconductor substrate into an amorphous form. The method may further include forming a metal-containing layer on a top surface of the plasma treated surface using an atomic layer deposition process.

Figure 1:
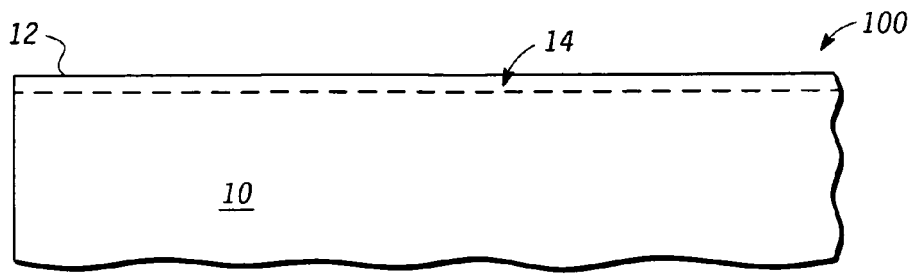
FIG. 1 is a cross section view of a semiconductor device during processing, consistent with one embodiment of the invention.

FIG. 1 is a cross section view of a semiconductor device during processing, consistent with one embodiment of the invention. Semiconductor device 100 may include a substrate 10. In one form substrate 10 may be a bulk semiconductor such as silicon, silicon germanium, or germanium, or any suitable semiconductor material. Alternatively, substrate 10 may be implemented as a silicon-on-insulator (SOI) substrate. As part of the first step, the top surface 12 of substrate 10 may be etched to remove any oxide, for example, native oxide formed on top surface 12 of substrate 10. By way of example, layer 14, which may be 10-20 Angstroms thick, may be etched away. Any suitable etching technique, such as dry etching or wet etching may be used. By way of example, hydrofluoric acid may be used to etch layer 14. Although FIG. 1 shows a bottom layer substrate 10 as being etched, a substrate like layer at another level of semiconductor device 100 may be etched similarly, as well.

Figure 2:
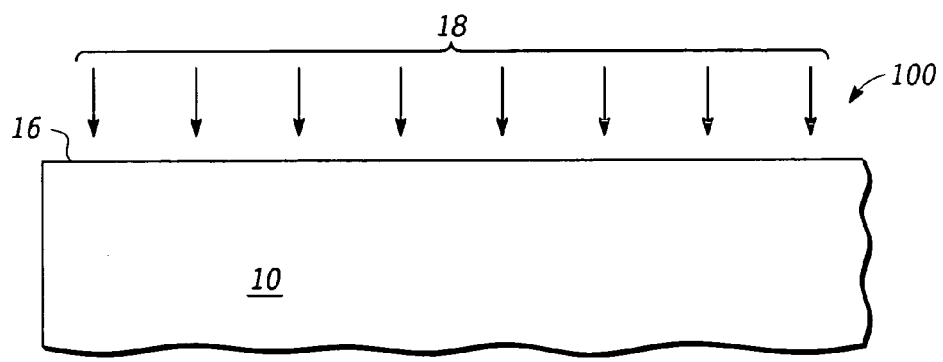
FIG. 2 is a cross section view of a semiconductor device being treated with plasma, consistent with one embodiment of the invention.
Figure 3:
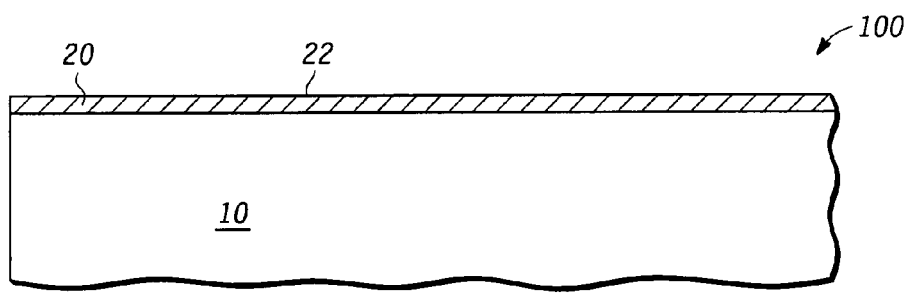
FIG. 3 is a cross section view of a semiconductor device with a plasma modified layer, consistent with one embodiment of the invention.

Next, as shown in FIG. 2, top surface 16 of semiconductor device 100 may be subjected to a plasma treatment 18. Use of hydrofluoric acid may make top surface 16 of substrate 10 hydrophobic. By way of example, an in-situ plasma treatment may be performed to neutralize hydrophobic surface (e.g., top surface 16 of semiconductor device 100). Plasma treatment 18 may be performed using power in a range of 100 watts to 1000 watts. Plasma treatment 18 may be performed for a duration of 1 second to 60 seconds. Any inert gas, such as Argon, Nitrogen, Helium, Xenon, or a combination thereof may be used as part of the plasma treatment beyond the plasma ignition stage. As shown in FIG. 3, plasma treatment may result in a plasma modified layer 20. Treating the exposed surface of the semiconductor substrate with plasma may improve the nucleation of the metal-containing layer on a top surface 22 of plasma modified layer 20. As a result of the plasma treatment, plasma modified layer 20 may be changed into a more amorphous form. By way of example, plasma modified layer 20 may be 10-100 Angstroms deep. To further aid in the process of changing plasma modified layer 20 into an amorphous form, additional gases such as, fluorine (e.g., $NF_3$, $F_2$, or $B_3F_6$,) chlorine (e.g., $Cl_2$), and/or nitrogen ($N_2$ or $NH_3$) may be used.

Figure 4:
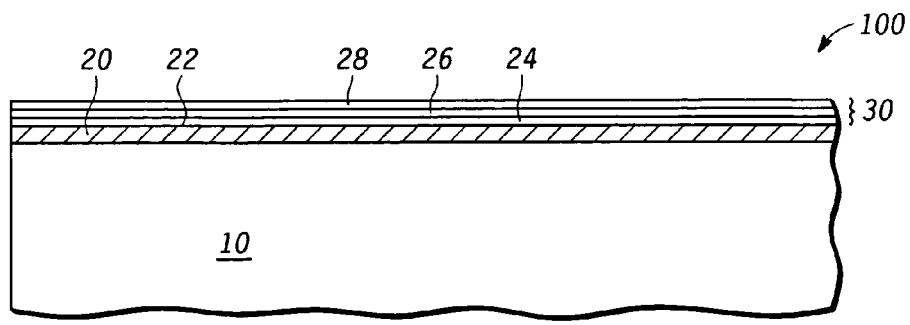
FIG. 4 is a cross section view of a semiconductor device with a gate dielectric, consistent with one embodiment of the invention.

Next, as shown in FIG. 4, using an atomic layer deposition process, a thin gate dielectric, such as a metal oxide may be deposited on a top surface 22 of plasma modified layer 20. Thin gate dielectric layer (e.g., a metal-containing layer) may be formed using multiple cycles of the atomic layer deposition process. Each cycle may result in at least a partial metal oxide layer being formed on top surface 22 of plasma modified layer 20. Using multiple atomic layer deposition cycles deposition fronts 24, 26, and 28 may result in formation of a metal-containing layer 30. By way of example, metal-containing layer 30 may be any metal oxide layer, such as, for example, hafnium dioxide, lanthanum oxide, yttrium oxide, titanium oxide, tantalum oxide, or an oxide having other rare earth metals or transition metals. The metal oxide may also include any number of metals, such as, for example, hafnium aluminum oxide, other metal aluminates, etc. Alternatively, metal-containing layer 30 may be any metal silicate layer, such as, for example, hafnium silicate, lanthanum silicate, and any other silicates having other rare earth metals or transition metals. Additionally and/or alternatively, metal-containing layer 30 may also include metal-silicon-oxynitride, such as $HfSi_xO_yN_z$.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a dielectric layer, comprising:
   providing a semiconductor substrate;
   etching a thin layer of the semiconductor substrate to expose a surface of the semiconductor substrate, wherein the exposed surface is hydrophobic;
   treating the exposed surface of the semiconductor substrate with plasma to neutralize a hydrophobicity associated with the exposed surface and form a plasma modified layer of an amorphous form between 10 to 100 Angstroms deep; and
   forming a metal-containing dielectric layer on a top surface of the plasma treated surface using an atomic layer deposition process.

2. The method of claim 1, wherein etching comprises using hydrofluoric acid to etch the thin layer.

3. The method of claim 1, wherein the plasma is performed in situ.

4. The method of claim 1, wherein the metal-containing dielectric layer comprises at least a metal oxide.

5. The method of claim 4, wherein the metal oxide is at least one of hafnium dioxide, lanthanum oxide, yttrium oxide, titanium oxide, tantalum oxide, zirconium oxide, or an oxide having other rare earth metals or transition metals, or any combination thereof.

6. The method of claim 1, wherein the metal-containing dielectric layer comprises at least one of metal silicate and metal-silicon-oxynitride.

7. The method of claim 6, wherein the metal silicate is at least one of hafnium silicate, lanthanum silicate, and any other silicates having other rare earth metals or transition metals, or any combination thereof.

8. The method of claim 1, wherein treating the exposed surface of the semiconductor substrate with plasma creates a plasma modified layer.

9. The method of claim 8, wherein treating the exposed surface of the semiconductor substrate with plasma improves the nucleation of the metal-containing dielectric layer on a top surface of the plasma modified layer.

10. The method of claim 1, wherein the exposed surface is treated using plasma with a power in a range of 100 watts to 500 watts for a duration in a range of 1 to 60 seconds.

11. The method of claim 1, wherein the metal-containing dielectric layer comprises hafnium dioxide.

12. The method of claim 1, wherein changing the top layer of the semiconductor substrate into an amorphous form comprises providing an additional gas including at least one of fluorine, chlorine, and nitrogen.

13. The method of claim 1, wherein the semiconductor substrate comprises at least one of silicon and germanium.

14. The method of claim 1, wherein the semiconductor substrate comprises a silicon-on-insulator substrate.

15. The method of claim 1, wherein forming the metal-containing dielectric layer comprises completing multiple cycles of the atomic layer deposition process.

16. The method of claim 1, wherein etching a thin layer comprises removing a native oxide formed on a top surface of the semiconductor substrate.

17. The method of claim 1, wherein the metal-containing layer further comprises aluminates.

18. The method of claim 1, wherein the metal-containing layer comprises hafnium silicate.

19. The method of claim 1, wherein the plasma includes an inert gas beyond the plasma ignition stage.

20. The method of claim 1, wherein the plasma modified layer is between about 11 and about 100 Angstroms deep.

* * * * *